US012745590B2

(12) United States Patent
Goshi

(10) Patent No.: US 12,745,590 B2
(45) Date of Patent: Sep. 22, 2026

(54) SUBSTRATE PROCESSING APPARATUS AND SUBSTRATE PROCESSING METHOD

(71) Applicant: Tokyo Electron Limited, Tokyo (JP)

(72) Inventor: Gentaro Goshi, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 461 days.

(21) Appl. No.: 17/661,095

(22) Filed: Apr. 28, 2022

(65) Prior Publication Data

US 2022/0359233 A1 Nov. 10, 2022

(30) Foreign Application Priority Data

May 10, 2021 (JP) ................................. 2021-079449

(51) Int. Cl.
*H01L 21/67* (2006.01)
*H01L 21/673* (2006.01)
(Continued)

(52) U.S. Cl.
CPC ...... *H10P 72/0448* (2026.01); *H10P 72/0604* (2026.01); *H10P 72/1926* (2026.01); *H10P 72/3218* (2026.01); *H10P 72/3411* (2026.01)

(58) Field of Classification Search
CPC ........... H01L 21/6715; H01L 21/67253; H01L 21/67393; H01L 21/6773; H01L 21/67778; H01L 21/67017; H01L 21/67028; H01L 21/67051; H01L 21/67086; H01L 21/67103; H01L 21/67748;
(Continued)

(56) References Cited

U.S. PATENT DOCUMENTS 5,882,433 A * 3/1999 Ueno ........................ B08B 3/02
134/33
2002/0197079 A1* 12/2002 Nakagawa ........ H01L 21/67253
396/564
(Continued)

FOREIGN PATENT DOCUMENTS

CN 1441466 A 9/2003
JP H09-162157 A 6/1997
(Continued)

OTHER PUBLICATIONS

JP 2003-297795 (Year: 2003).*
JP 2018-050001 (Year: 2018).*

*Primary Examiner* — Alexander Markoff
(74) *Attorney, Agent, or Firm* — Armstrong Teasdale LLP

(57) ABSTRACT

A substrate processing apparatus includes: a batch processor configured to collectively process a lot including plural substrates; a single-wafer processor configured to process the substrates included in the lot one by one; and a transport portion configured to deliver the substrates one by one between the batch processor and the single-wafer processor. The batch processor includes a processing tank configured to store a processing liquid including a rinsing liquid. The transport portion includes a fluid supplier configured to supply, after receiving the substrates included in the lot in the processing tank and until delivering the substrates to the single-wafer processor, a low surface tension fluid having a lower surface tension than the rinsing liquid to at least one of the processing tank and the substrates.

6 Claims, 13 Drawing Sheets

(51) Int. Cl.
*H01L 21/677* (2006.01)
*H10P 72/00* (2026.01)
*H10P 72/10* (2026.01)
*H10P 72/30* (2026.01)

(58) Field of Classification Search
CPC ......... H01L 21/67057; H01L 21/67155; H01L 21/67034; H01L 21/6704; H01L 21/67703; H01L 21/68707; H01L 21/02057; H01L 21/67173; H01L 21/67757; H10P 72/0448; H10P 72/0604; H10P 72/1926; H10P 72/3218; H10P 72/3411; H10P 72/0402; H10P 72/0414; H10P 72/0416; H10P 72/0406; H10P 72/0426; H10P 72/0432; H10P 72/3306; H10P 72/0408; H10P 72/0411; H10P 72/0451; H10P 72/32; H10P 70/20; H10P 72/0456; H10P 72/3312; H10P 72/7602
See application file for complete search history.

(56) References Cited

U.S. PATENT DOCUMENTS

2002/0197869 A1* 12/2002 Nakagawa .............. G03F 7/422
438/689
2006/0137721 A1* 6/2006 Kuroda ............... H01L 21/6704
134/26
2011/0220152 A1* 9/2011 Kitajima ........... H01L 21/67028
134/26
2011/0220153 A1* 9/2011 Tanaka .............. H01L 21/67057
134/61
2013/0081297 A1* 4/2013 Nakashima ....... H01L 21/67034
34/201
2014/0130367 A1 5/2014 Yonekawa
2014/0283887 A1* 9/2014 Tanaka .............. H01L 21/67028
134/58 R
2016/0336170 A1* 11/2016 Ishida ............... H01L 21/67051
2017/0278725 A1* 9/2017 Marumoto ........ H01L 21/67028
2019/0013217 A1* 1/2019 Marumoto ........ H01L 21/67051
2020/0126831 A1* 4/2020 Feng ......................... B08B 3/02
2020/0203193 A1 6/2020 Nam et al.
2020/0211865 A1* 7/2020 Otsu ................. H01L 21/67086
2021/0111038 A1* 4/2021 Kanagawa ........ H01L 21/67748
2021/0111054 A1* 4/2021 Kanagawa ........ H01L 21/02057
2022/0208567 A1* 6/2022 Nakashima ....... H01L 21/02101
2022/0301880 A1* 9/2022 Yamashita ................ B08B 3/08
2022/0359233 A1* 11/2022 Goshi ................. H01L 21/6773

FOREIGN PATENT DOCUMENTS

JP 2003-297795 A 10/2003
JP 2008-198958 A 8/2008
WO 2012133583 A1 10/2012
WO 2021039449 A1 3/2021

* cited by examiner

Figure 8:
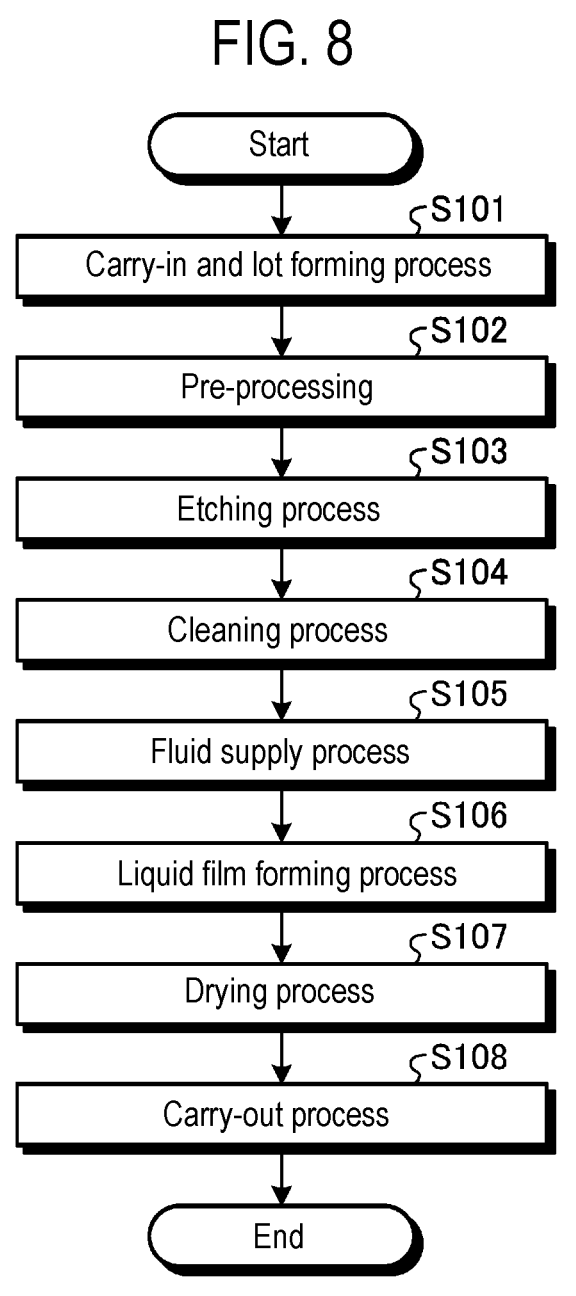

Start

S101 Carry-in and lot forming process

S102 Pre-processing

S103 Etching process

S104 Cleaning process

S105 Fluid supply process

S106 Liquid film forming process

S107 Drying process

S108 Carry-out process

End

FIG. 16

6
541
542
IPA
IPA
W
531
Wa
532

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2021-079449, filed on May 10, 2021, the entire contents of which are incorporated herein by reference.

TECHNICAL FIELD

Embodiments disclosed herein relate to a substrate processing apparatus and a substrate processing method.

BACKGROUND

In the related arts, there is known a substrate processing system that includes both a single-wafer-type processor (single-wafer processor) that processes substrates such as semiconductor wafers one by one and a batch-type processor (batch processor) that collectively processes plural substrates, and transports the substrates one by one from the batch processor to the single-wafer processor.

PRIOR ART DOCUMENT

Patent Document

Japanese Laid-Open Patent Publication No. H09-162157

SUMMARY

According to one embodiment of the present disclosure, there is provided a substrate processing apparatus that includes: a batch processor configured to collectively process a lot including plural substrates; a single-wafer processor configured to process the substrates included in the lot one by one; and a transport portion configured to deliver the substrates one by one between the batch processor and the single-wafer processor. The batch processor includes a processing tank configured to store a processing liquid including a rinsing liquid. The transport portion includes a fluid supplier configured to supply, after receiving the substrates included in the lot in the processing tank and until delivering the substrates to the single-wafer processor, a low surface tension fluid having a lower surface tension than the rinsing liquid to at least one of the processing tank and the substrates.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a schematic plan view illustrating an IF area, a single-wafer area, and a carry-out area in the substrate processing system according to the embodiment.

FIG. 8 is a flowchart illustrating a processing procedure executed by the substrate processing system according to the embodiment.

FIG. 16 is a view illustrating a liquid film forming process according to an embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a substrate processing apparatus and a substrate processing method disclosed herein will be described in detail with reference to the accompanying drawings. The present disclosure is not limited by each embodiment to be described below. It is necessary to note that the drawings are schematic and that there may be a case in which the dimensional relationships, ratios, and the like of respective elements differ from the reality. Even between the drawings, some parts may have different dimensional relationships or ratios.

In the related arts, there is known a substrate processing system that includes both a single-wafer-type processor (single-wafer processor) that processes substrates such as semiconductor wafers one by one and a batch-type processor (batch processor) that collectively processes plural substrates, and transports the substrates one by one from the batch processor to the single-wafer processor.

In this single-wafer processor, a liquid film may be formed on a pattern forming surface of the substrate, and the substrate may be dried using a processing fluid in a supercritical state (hereinafter, also referred to as "supercritical drying process").

However, in the above-described related arts, when the contact angle of the substrate surface is large in the substrate processing up to that point, at least a portion of the substrate surface (e.g., the peripheral edge of the substrate) may be dried out while the substrate is being transported from the batch processor to the single-wafer processor. When a portion of the surface of the substrate is dried out, a pattern may collapse in the dried-out portion.

Therefore, a technique that is capable of overcoming the above-described problems and suppressing the collapse of a pattern formed on a surface of a substrate is expected.

<Configuration of Substrate Processing System>

Figure 1:
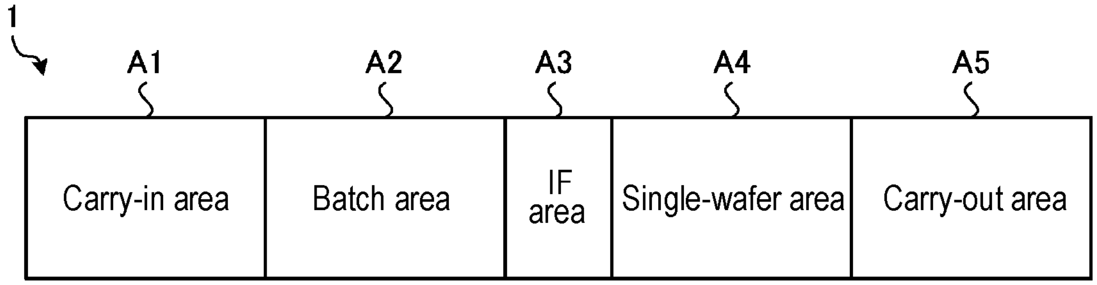
FIG. 1 is a block diagram illustrating a schematic configuration of a substrate processing system according to an embodiment.

First, a schematic configuration of the substrate processing system according to an embodiment will be described with reference to FIG. 1. FIG. 1 is a block diagram showing a schematic configuration of a substrate processing system 1 according to an embodiment.

As illustrated in FIG. 1, the substrate processing system 1 according to the embodiment includes a carry-in area A1, a batch area A2, an interface (IF) area A3, a single-wafer area A4, and a carry-out area A5. The carry-in area A1, the batch area A2, the IF area A3, the single-wafer area A4, and the carry-out area A5 are arranged in this order.

In the substrate processing system 1 according to the embodiment, first, carry-in of a semiconductor wafer (hereinafter, simply referred to as a "wafer") is performed in the carry-in area A1. The carry-in area A1 is provided with a first placement portion 20 (see FIG. 2) on which a carrier C (see FIG. 2) accommodating plural wafers W (see FIG. 2) is placed, or the like.

In the carry-in area A1, a process of taking out plural wafers W from the carrier C placed on the first placement portion 20 to form a lot, a process of transferring the formed lot to the batch area, and the like are performed.

The batch area A2 is provided with a batch processor that collectively processes wafers W in lot units or the like. In the embodiment, in the batch area A2, an etching process of the wafer W or the like is performed in lot units by using the batch processor. In addition, the batch area A2 is provided with a lot transport mechanism for transporting a lot. The lot transport mechanism transports the lot formed in the carry-in area A1 to the batch area A2.

In the IF area A3, delivery (transport) of the wafers W from the batch area A2 to the single-wafer area A4 is performed. The IF area A3 is provided with a transport portion that transports the wafers W one by one, and the wafers W are transported one by one from the batch area to the single-wafer area by using such a transport portion.

The single-wafer area A4 is provided with a single-wafer processor that processes wafers W one by one. In the embodiment, the single-wafer area A4 includes a liquid processor 6 (see FIG. 3) into which the wafers are carried from the IF area A3, and a dryer 7 (FIG. 3) that processes the wafers processed by the liquid processor 6 (see FIG. 3). The liquid processor 6 and the dryer 7 are examples of the single-wafer processor.

Specifically, the liquid processor 6 forms a liquid film on the surface of a wafer W. In addition, the dryer 7 brings a wafer W having a liquid film formed on the surface thereof into contact with a supercritical fluid to dry the wafer.

That is, in the substrate processing system 1 according to the embodiment, an etching process of the wafer W is performed in lot units in the batch area A2, and then a wafer W drying process is performed one by one in the single-wafer area A4.

The carry-out area A5 is provided with a second placement portion 93 (see FIG. 3) on which an empty carrier C (see FIG. 3) is placed, or the like. In the carry-out area A5, a process of accommodating the wafers that have been dried in the single-wafer area A4 in the carrier C mounted on the second placement portion 93 is performed.

Figure 2:
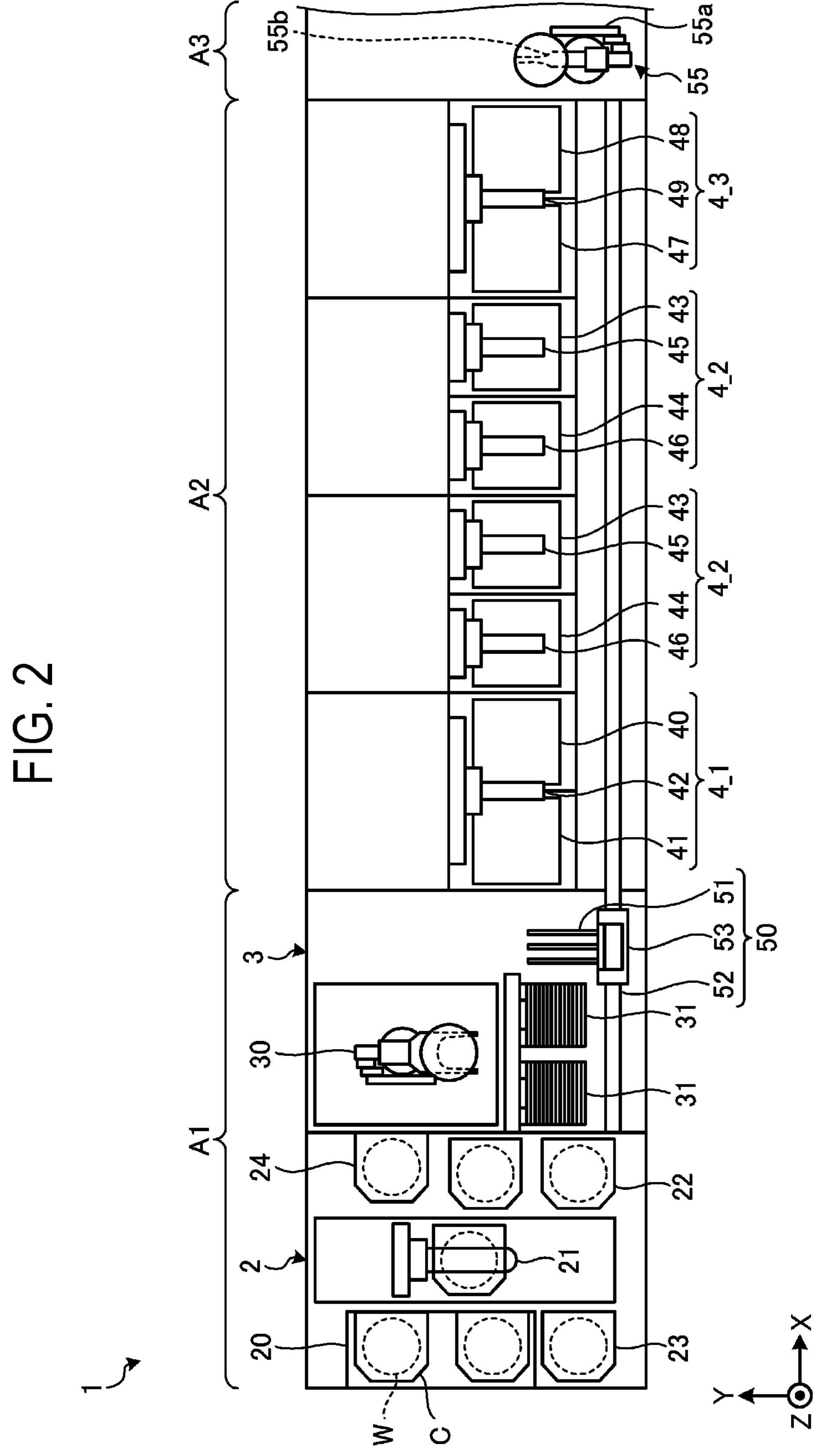
FIG. 2 is a schematic plan view illustrating a carry-in area, a batch area, and an IF area in the substrate processing system according to the embodiment.

Next, a specific configuration of the substrate processing system 1 according to the embodiment will be described with reference to FIGS. 2 and 3. FIG. 2 is a schematic plan view of the carry-in area A1, the batch area A2, and the IF area A3 in the substrate processing system 1 according to the embodiment.

First, the configurations of the carry-in area A1, the batch area A2, and the IF area A3 will be described with reference to FIG. 2.

(Regarding Carry-In Area)

As illustrated in FIG. 2, a carrier carry-in portion 2 and a lot forming portion 3 are arranged in the carry-in area A1. The carrier carry-in portion 2 and the lot forming portion 3 are arranged along the arrangement direction (the X-axis direction) of the areas A1 to A5. The lot forming portion 3 is adjacent to the batch area A2.

The carrier carry-in portion 2 includes the first placement portion 20, a first transport mechanism 21, carrier stocks 22 and 23, and a carrier stage 24.

Carriers C transported from the exterior are placed on the first placement portion 20. The carrier C is a container which accommodates plural wafers W (e.g., 25 wafers W) arranged vertically in a horizontal posture. The first transport mechanism 21 transports the carriers C among the first placement portion 20, the carrier stocks 22 and 23, and the carrier stage 24.

The lot forming portion 3 includes a second transport mechanism 30 and lot holders 31 (e.g., two lot holders 31), and forms lots each composed of plural wafers W. In an embodiment, a lot is formed by combining a total of 50 wafers W accommodated in two carriers C.

The plural wafers W forming one lot are arranged at regular intervals (a given pitch) in the state in which the main surfaces thereof face each other. The main surfaces are, for example, pattern forming surfaces of the wafers W. The given pitch is, for example, the distance corresponding to half the pitch between plural wafers W (e.g., 25 wafers W) accommodated in each carrier C.

In the embodiment, the given pitch is 5 mm. The number of wafers W constituting a lot is not limited to 50. For example, the lot may consist of 100 wafers W.

The second transport mechanism 30 transports the wafers W between the carrier C placed on the carrier stage 24 and the lot holder 31. The second transport mechanism 30 includes, for example, an articulated robot, and transports plural wafers W (for example, 25 wafers W) at once. The second transport mechanism 30 is able to change the posture of the wafers W from the horizontal posture to the vertical posture during transport.

The lot holder 31 holds the plural wafers W for one lot in a vertical posture. The second transport mechanism 30 takes out the plural wafers W from the carrier C placed on the carrier stage 24 and places the wafers on the lot holder 31 in a vertical posture. For example, by repeating this operation twice, one lot is formed.

(Regarding Batch Area)

In the batch area A2, a pre-processor 4_1, etching processors 4_2 (here, two etching processors 4_2), and a post-processor 4_3 are arranged. The pre-processor 4_1, the etching processors 4_2, and the post-processor 4_3 are examples of batch processors.

The pre-processor 4_1, the etching processors 4_2, and the post-processor 4_3 are arranged in this order along the arrangement direction of the areas A1 to A5 (the X-axis direction). In addition, the pre-processor 4_1 is adjacent to the carry-in area A1, and the post-processor 4_3 is adjacent to the IF area A3.

The pre-processor 4_1 includes a processing tank 40 for pre-processing, a processing tank 41 for rinsing, and a lot immersion mechanism 42.

The processing tank 40 and the processing tank 41 are capable of accommodating one lot of the wafers W arranged in a vertical posture. The processing liquid for pre-processing is stored in the processing tank 40. For example, a dilute hydrofluoric acid (DHF) is stored in the processing tank 40 as a processing liquid for pre-processing (here, for removing a natural oxide film). In addition, a processing liquid for rinsing (e.g., deionized water (DIW)) is stored in the processing tank 41.

The lot immersion mechanism 42 holds the wafers W forming a lot in a vertical posture at regular intervals. The lot immersion mechanism 42 includes a lifting mechanism that raises and lowers a lot held by the lot immersion mechanism 42, and may immerse the lot in the processing tank 40 or 41 by lowering the lot from above the processing tank 40 or 41 or take out the lot immersed in the processing tank 41 or 42 by raising the lot from the processing tank 40 or 41.

In addition, the lot immersion mechanism 42 includes a horizontal movement mechanism, and may horizontally move the lot between a position above the processing tank 40 and a position above the processing tank 41. Here, an example is illustrated in which the processing tank 40 for pre-processing is disposed on the positive side of the processing tank 41 for rinsing in the X-axis direction, but the processing tank 40 for pre-processing may be disposed on the negative side of the processing tank 41 for rinsing in the X-axis direction.

The etching processor 4_2 includes a processing tank 43 for etching, a processing tank 44 for rinsing, and lot immersion mechanisms 45 and 46.

The processing tank 43 and the processing tank 44 are capable of accommodating one lot of wafers W arranged in a vertical posture. The processing tank 43 stores a processing liquid for etching (hereinafter, also referred to as an "etching liquid"). The details of the processing tank 43 will be described later. A processing liquid for rinsing (e.g., DIW or the like) is stored in the processing tank 44.

The lot immersion mechanisms 45 and 46 hold the plural wafers W forming a lot in a vertical posture at regular intervals. The lot immersion mechanism 45 includes a lifting mechanism that raises and lowers a lot held by the lot immersion mechanism 45, and may immerse the lot in the processing tank 43 by lowering the lot from above the processing tank 43 or take out the lot immersed in the processing tank 43 by raising the lot from the processing tank 43.

Similarly, the lot immersion mechanism 46 also includes a lifting mechanism that raises and lowers a lot held by the lot immersion mechanism 46, and may immerse the lot in the processing tank 44 by lowering the lot from above the processing tank 44 or take out the lot immersed in the processing tank 44 by raising the lot from the processing tank 44.

Here, an example is illustrated in which the processing tank 43 for etching is disposed on the positive side of the processing tank 44 for rinsing in the X-axis direction, but the processing tank 43 for etching may be disposed on the negative side of the processing tank 44 in the X-axis direction.

The post-processor 4_3 includes a processing tank 47 for post-processing, a processing tank 48 for rinsing, and a lot immersion mechanism 49. The processing tank 47 and the processing tank 48 are capable of accommodating one lot of wafers W arranged in a vertical posture.

A processing liquid for post-processing is stored in the processing tank 47. For example, SC1 (a mixed liquid of ammonia, hydrogen peroxide, and water) is stored in the processing tank 40 as a processing liquid for post-processing (here, for cleaning). In addition, a processing liquid L1 for rinsing is stored in the processing tank 48. The processing tank 48 for rinsing is located adjacent to the IF area A3. The details of the processing tank 48 will be described later.

The lot immersion mechanism 49 holds the plural wafers W forming a lot in a vertical posture at regular intervals. The lot immersion mechanism 49 includes a lifting mechanism that raises and lowers a lot held by the lot immersion mechanism 49, and may immerse the lot in the processing tank 47 or 48 by lowering the lot from above the processing tank 47 or 48 or take out the lot immersed in the processing tank 47 or 48 by raising the lot from the processing tank 47 or 48.

In addition, the lot immersion mechanism 49 includes a horizontal movement mechanism, and may horizontally move a lot between a position above the processing tank 47 and a position above the processing tank 48.

Here, an example is illustrated in which four batch processors (a pre-processor 4_1, plural etching processors 4_2, and a post-processor 4_3) are arranged in the batch area A2, but the number of batch processors is not limited to this example, and may be, for example, one.

The substrate processing system 1 includes a third transport mechanism 50. The third transport mechanism 50 is disposed to extend over the carry-in area A1 and the batch area A2, and transports a lot from the carry-in area A1 to the batch area A2.

The third transport mechanism 50 includes a holding body 51, a rail 52, and a moving body 53. The holding body 51 holds a lot in a state in which the plural wafers W are in a vertical posture. The rail 52 extends along the X-axis direction from the lot holder 31 of the carry-in area A1 to the processing tank 48 of the batch area A2. The moving body 53 is provided on the rail 52 and moves the holding body 51 along the rail 52.

The third transport mechanism 50 holds the lot held in the lot holder 31 by using the holding body 51, and transports the held lot to the batch area A2. Then, the third transport mechanism 50 transports the lot in the order of the pre-processor 4_1, the etching processor 4_2, and the post-processor 4_3.

(Regarding Processing Tank for Etching)

Figure 4:
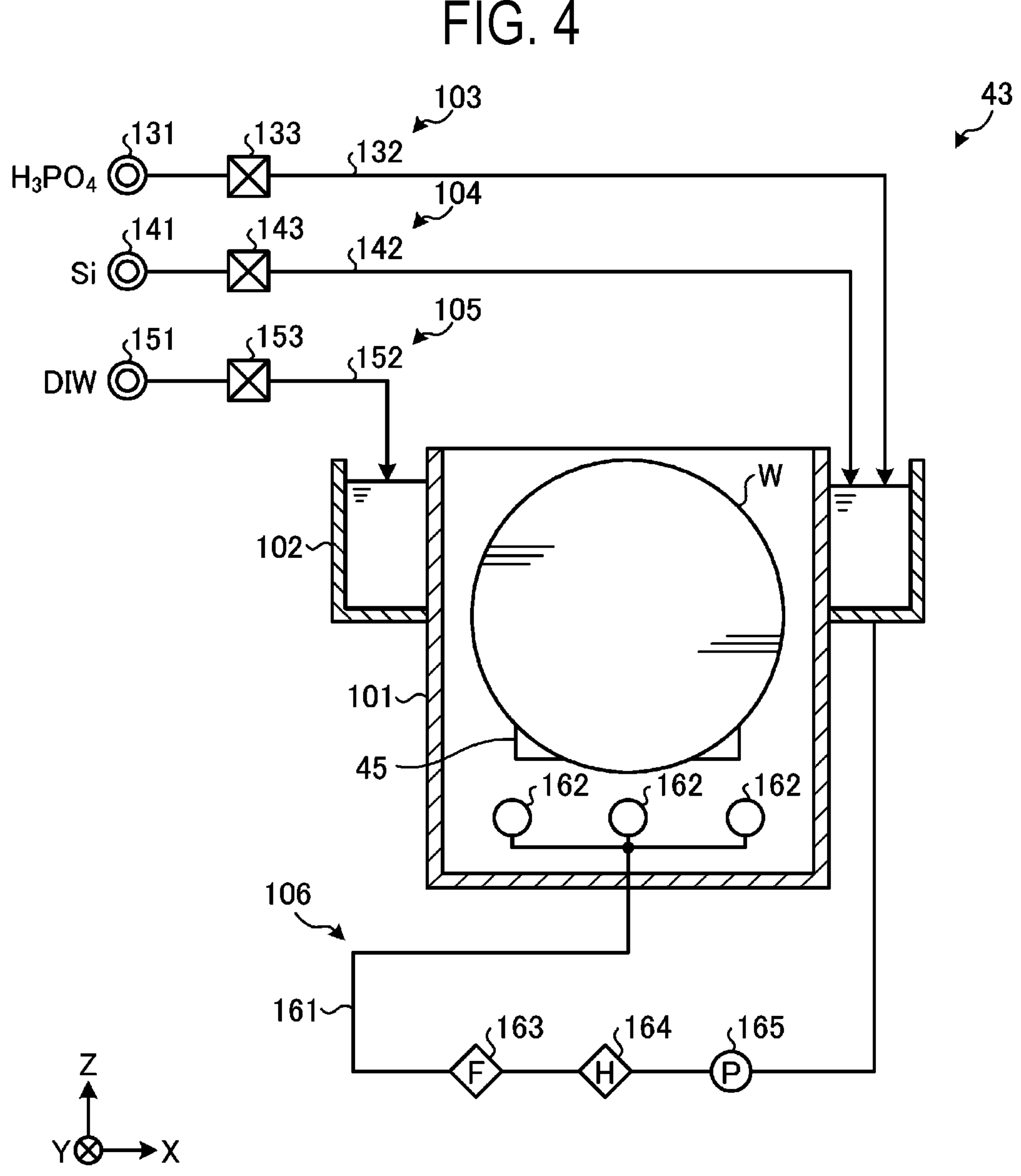
FIG. 4 is a block diagram illustrating the configuration of a processing tank for etching according to an embodiment.

Here, the processing tank 43 for etching will be described with reference to FIG. 4. FIG. 4 is a block diagram illustrating the configuration of the processing tank 43 for etching according to an embodiment.

In the processing tank 43, an etching process is performed in which a silicon nitride film is selectively etched out of a silicon nitride film (SiN) and a silicon oxide film ($SiO_2$) formed on the wafer W by using a given etching liquid. In such an etching process, a solution in which a silicon (Si)-containing compound is added to an aqueous solution of phosphoric acid ($H_3PO_4$) to adjust a silicon concentration is used as an etching liquid.

As a method for adjusting the silicon concentration in the etching liquid, a method of immersing a dummy substrate in a phosphoric acid aqueous solution to dissolve silicon (seasoning) or a method of dissolving a silicon-containing compound such as colloidal silica in a phosphoric acid aqueous solution may be used. The silicon concentration may be adjusted by adding a silicon-containing compound aqueous solution to the phosphoric acid aqueous solution.

As illustrated in FIG. 4, the processing tank 43 for etching includes an inner tank 101 and an outer tank 102. The inner tank 101 is an upwardly opened box-shaped tank, and stores an etching liquid therein. A lot formed by the plural wafers W is immersed in the inner tank 101. The outer tank 102 is opened upwardly and is disposed around the upper portion of the inner tank 101. The etching liquid overflowing from the inner tank 101 flows into the outer tank 102.

The processing tank 43 includes a phosphoric acid aqueous solution supplier 103, a silicon supplier 104, and a DIW supplier 105. The phosphoric acid aqueous solution supplier 103 includes a phosphoric acid aqueous solution source 131, a phosphoric acid aqueous solution supply line 132, and a flow rate regulator 133.

The phosphoric acid aqueous solution source 131 supplies a phosphoric acid aqueous solution in which a phosphoric acid concentration is concentrated to a desired concentration. The phosphoric acid aqueous solution supply line 132 connects the phosphoric acid aqueous solution source 131 and the outer tank 102 to supply the phosphoric acid aqueous solution from the phosphoric acid aqueous solution source 131 to the outer tank 102.

The flow rate regulator 133 is provided in the phosphoric acid aqueous solution supply line 132, and adjusts the supply amount of the phosphoric acid aqueous solution supplied to the outer tank 102. The flow rate regulator 133 includes, for example, an opening/closing valve, a flow rate control valve, and a flow meter.

The silicon supplier 104 includes a silicon source 141, a silicon supply line 142, and a flow rate regulator 143.

The silicon source 141 is a tank for storing an aqueous solution of a silicon-containing compound. The silicon supply line 142 interconnects the silicon source 141 and the outer tank 102, and supplies the silicon-containing compound aqueous solution from the silicon source 141 to the outer tank 102.

The flow rate regulator 143 is provided in the silicon supply line 142 and adjusts the supply amount of the silicon-containing compound aqueous solution supplied to the outer tank 102. The flow rate regulator 143 includes an opening/closing valve, a flow rate control valve, a flow meter, or the like. The silicon concentration of the etching liquid is adjusted by regulating the supply amount of the silicon-containing compound aqueous solution by the flow rate regulator 143.

The DIW supplier 105 includes a DIW source 151, a DIW supply line 152, and a flow rate regulator 153. The DIW supplier 105 supplies DIW to the outer tank 102 in order to replenish the water evaporated by heating the etching liquid. The DIW supply line 152 interconnects the DIW source 151 and the outer tank 102, and supplies DIW at a predetermined temperature from the DIW source 151 to the outer tank 102.

The flow rate regulator 153 is provided in the DIW supply line 152 and adjusts the supply amount of the DIW supplied to the outer tank 102. The flow rate regulator 153 includes an opening/closing valve, a flow rate control valve, a flow meter, or the like. The supply amount of DIW is regulated by the flow rate regulator 153, so that the temperature, phosphoric acid concentration, and silicon concentration of the etching liquid are adjusted.

The processing tank 43 includes a circulator 106. The circulator 106 circulates the etching liquid between the inner tank 101 and the outer tank 102. The circulator 106 includes a circulation line 161, processing liquid supply nozzles 162, a filter 163, a heater 164, and a pump 165.

The circulation line 161 interconnects the outer tank 102 and the inner tank 101. One end of the circulation line 161 is connected to the outer tank 102, and the other end of the circulation line 161 is connected to the processing liquid supply nozzles 162 disposed inside the inner tank 101.

The filter 163, the heater 164, and the pump 165 are provided in the circulation line 161. The filter 163 removes impurities from the etching liquid flowing through the circulation line 161. The heater 164 heats the etching liquid flowing through the circulation line 161 to a temperature suitable for an etching process.

The pump 165 sends the etching liquid in the outer tank 102 to the circulation line 161. The pump 165, the heater 164, and the filter 163 are provided in this order from the upstream side.

The circulator 106 sends the etching liquid from the outer tank 102 into the inner tank 101 via the circulation line 161 and the processing liquid supply nozzles 162. The etching liquid sent into the inner tank 101 overflows from the inner tank 101, thereby flowing out to the outer tank 102 again. In this way, the etching liquid circulates between the inner tank 101 and the outer tank 102.

The circulator 106 may turn the etching liquid into a boiling state by heating the etching liquid with the heater 164.

(Regarding Processing Tank for Rinsing)

Figure 5:
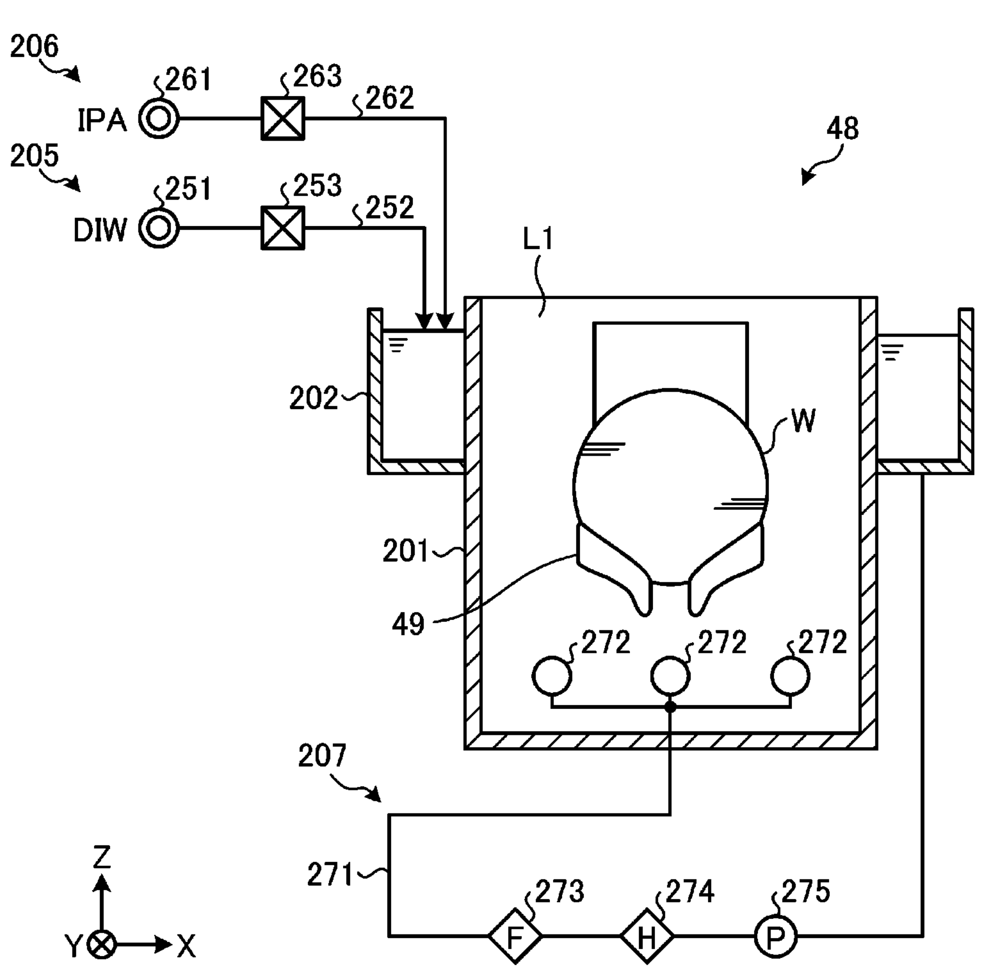
FIG. 5 is a block diagram illustrating the configuration of a processing tank for rinsing according to an embodiment.

Next, the processing tank 48 for rinsing will be described with reference to FIG. 5. FIG. 5 is a block diagram illustrating the configuration of the processing tank 48 for rinsing according to an embodiment.

As illustrated in FIG. 5, the processing tank 48 for rinsing includes an inner tank 201 and an outer tank 202. The inner tank 201 is an upwardly opened box-shaped tank, and stores a rinsing processing liquid L1 therein. A lot formed by the plural wafers W is immersed in the inner tank 201. The outer tank 202 is opened upwardly and is arranged around the upper portion of the inner tank 201. The processing liquid L1 overflowing from the inner tank 201 flows into the outer tank 202.

The processing tank 48 includes a DIW supplier 205 and an IPA supplier 206. The IPA supplier 206 is an example of a fluid supplier.

The DIW supplier 205 includes a DIW source 251, a DIW supply line 252, and a flow rate regulator 253. The DIW source 251 supplies DIW. This DIW is an example of a rinsing liquid. The DIW supply line 252 interconnects the DIW source 251 and the outer tank 202, and supplies DIW at a given temperature from the DIW source 251 to the outer tank 202.

The flow rate regulator 253 is provided in the DIW supply line 252 and adjusts the supply amount of the DIW supplied to the outer tank 202. The flow rate regulator 253 includes, for example, an opening/closing valve, a flow rate control valve, and a flow meter.

The IPA supplier 206 includes an IPA source 261, an IPA supply line 262, and a flow rate regulator 263. The IPA source 261 supplies isopropyl alcohol (IPA). The IPA is an example of a low surface tension fluid. The IPA supply line 262 interconnects the IPA source 261 and the outer tank 202, and supplies IPA at a given temperature from the IPA source 261 to the outer tank 202.

The flow rate regulator 263 is provided in the IPA supply line 262 and adjusts the supply amount of the IPA supplied to the outer tank 202. The flow rate regulator 263 includes, for example, an opening/closing valve, a flow rate control valve, and a flow meter.

In the embodiment, the controller 12 (see FIG. 3) controls the DIW supplier 205 and the IPA supplier 206 to control the processing liquid L1 having a given IPA concentration (e.g., 10% or more) and store the processing liquid in the processing tank 48.

The processing tank 43 includes a circulator 207. The circulator 207 circulates the processing liquid L1 between the inner tank 201 and the outer tank 202. The circulator 207 includes a circulation line 271, processing liquid supply nozzles 272, a filter 273, a heater 274, and a pump 275.

The circulation line 271 interconnects the outer tank 202 and the inner tank 201. One end of the circulation line 271 is connected to the outer tank 202, and the other end of the circulation line 271 is connected to the processing liquid supply nozzles 272 disposed inside the inner tank 201.

The filter 273, the heater 274, and the pump 275 are provided in the circulation line 271. The filter 273 removes impurities from the processing liquid L1 flowing through the circulation line 271. The heater 274 heats the processing liquid L1 flowing through the circulation line 271 to a temperature suitable for the rinsing processing.

The pump 275 sends the processing liquid L1 in the outer tank 202 to the circulation line 271. The pump 275, the heater 274, and the filter 273 are provided in this order from the upstream side.

The circulator 207 sends the processing liquid L1 from the outer tank 202 into the inner tank 201 via the circulation line 271 and the processing liquid supply nozzles 272. The processing liquid L1 sent into the inner tank 201 overflows from the inner tank 201, thereby flowing out to the outer tank 202 again. In this way, the processing liquid L1 circulates between the inner tank 201 and the outer tank 202.

(Regarding IF Area)

Return to the description made with reference to FIG. 2. A fourth transport mechanism 55 is disposed in the IF area A3. The fourth transport mechanism 55 is an example of a transport portion. The fourth transport mechanism 55 includes, for example, an articulated robot, and transports wafers W one by one. The fourth transport mechanism 55 is able to change the posture of the wafers W from the vertical posture to the horizontal posture during transport.

The fourth transport mechanism 55 takes out one wafer W from the lot immersed in the processing tank 48 for rinsing provided in the post-processor 4_3, changes the posture of the taken-out wafer W from the vertical posture to the horizontal posture, and then carries the wafer W into the liquid processor 6 of the single-wafer area A4, which will be described later.

The fourth transport mechanism 55 is an articulated robot including an arm 55*a* in which arm segments are rotatably connected by rotation shafts. A holder 55*b* is connected to the tip end of the arm 55*a*. The fourth transport mechanism 55 may operate the arm 55*a* to change the posture of the holder 55*b* between the vertical posture and the horizontal posture. The holder 55*b* is configured to be able to hold the wafers W one by one.

(Regarding Single-Wafer Area and Carry-out Area)

Next, the configurations of the single-wafer area A4 and the carry-out area A5 will be described with reference to FIG. 3. FIG. 3 is a schematic plan view illustrating the IF area A3, the single-wafer area A4, and the carry-out area A5 in the substrate processing system 1 according to the embodiment. In the single-wafer area A4, a liquid processor 6, a dryer 7, and a fifth transport mechanism 8 are disposed.

The liquid processor 6, the fifth transport mechanism 8, and the dryer 7 are arranged in this order along a direction orthogonal to the arrangement direction of the areas A1 to A5 (Y-axis direction). Specifically, the fifth transport mechanism 8 is disposed in the center of the single-wafer area A4, and the liquid processor 6 is disposed on one side in the Y-axis direction (here, the negative side in the Y-axis direction) of the fifth transport mechanism 8. The dryer 7 is disposed on the opposite side to the liquid processor 6 with the fifth transport mechanism 8 interposed therebetween.

The liquid processor 6 performs liquid processing on the wafers W transported from the processing tank 48 (see FIG. 2) by the fourth transport mechanism 55. Specifically, the liquid processor 6 forms a liquid film of the drying processing liquid on the surfaces of the wafers W. The details of this liquid film forming process will be described later. The wafers W on which the liquid film is formed by the liquid processor 6 are taken out from the liquid processor 6 and transported to the dryer 7 by the fifth transport mechanism 8.

The liquid processor 6 includes a carry-in port 61 of the wafer W and a carry-out port 62 of the wafer W. The carry-in port 61 is provided at a position facing the IF area A3, and wafers W are carried in therethrough by the fourth transport mechanism 55. The carry-out port 62 is provided at a position facing the fifth transport mechanism 8, and wafers W are carried out therethrough. By providing the carry-in port 61 and the carry-out port 62 at different positions in this way, it is possible to efficiently perform carry-in/out of wafers W with respect to the liquid processor 6.

The carry-out port 62 may be provided at a position facing a delivery area 72. In this case, since the distance over which the wafers W on which a liquid film has been formed is transported from the liquid processor 6 to the dryer 7 by the fifth transport mechanism 8 is the shortest, it is possible to suppress the drying of the liquid film.

The dryer 7 performs a supercritical drying process on the wafers W on which a liquid film has been formed by the liquid processor 6. Specifically, the dryer 7 dries the wafers W by bringing the wafers W on which the liquid film has been formed into contact with a processing fluid in a supercritical state.

The dryer 7 includes a processing area 71 in which supercritical drying processing is performed, and a delivery area 72 in which the wafers W are delivered between the fifth transport mechanism 8 and the processing area 71.

In the single-wafer area A4, a supplier 73 is disposed at a position adjacent to the processing area 71 of the dryer 7. The supplier 73 supplies a processing fluid to the processing area 71 of the dryer 7. The supplier 73 includes a supply device group including a flow meter, a flow rate regulator, a back pressure valve, a heater, and the like, and a housing accommodating the supply device group. In the embodiment, the supplier 73 supplies $CO_2$ as a processing fluid to the dryer 7.

The fifth transport mechanism 8 includes a holder that holds a wafer W. The fifth transport mechanism 8 is capable of moving in the horizontal direction and the vertical direction and turning around a vertical axis, and transports the wafer W by using a holding body. Specifically, the fifth transport mechanism 8 transports the wafer W from the liquid processor 6 to the dryer 7, and transports the wafer W from the dryer 7 to a wafer stage 91 in the carry-out area A5, which will be described later.

(Regarding Liquid Processor)

Figure 6:
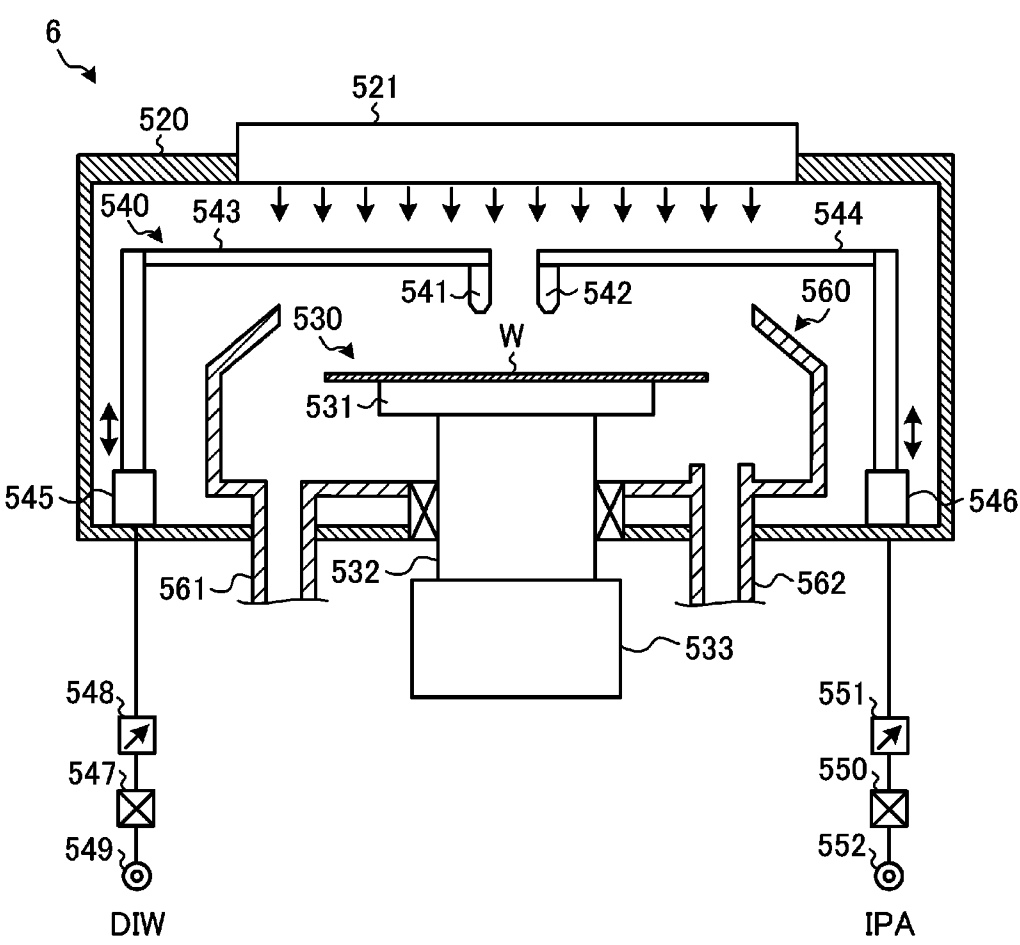
FIG. 6 is a schematic view illustrating the configuration of a liquid processor according to an embodiment.

Here, the configurations of the liquid processor 6 and the dryer 7 will be described. First, the configuration of a liquid processor 6 will be described with reference to FIG. 6. FIG. 6 is a schematic view illustrating the configuration of the liquid processor 6 according to an embodiment.

As illustrated in FIG. 6, the liquid processor 6 includes a chamber 520, a substrate rotator 530, a processing liquid supplier 540, and a recovery cup 560.

The chamber 520 accommodates the substrate rotator 530, the processing liquid supplier 540, and the recovery cup 560. The ceiling of the chamber 520 is provided with a fan filter unit (FFU) 521. The FFU 521 forms a downflow in the chamber 520.

The substrate rotator 530 includes a holding portion 531, a column 532, and a driver 533, and holds and rotates a wafer W. The holder 531 attracts the bottom surface of the wafer W and holds the wafer W horizontally. The holder 531 is not limited to holding the bottom surface of a wafer W, and may hold the end portions of a wafer W.

The column 532 is a member extending in the vertical direction, in which the base end of the column 532 is rotatably supported by the driver 533 and the tip end thereof horizontally supports the holder 531. The driver 533 rotates the column 532 around a vertical axis.

The substrate rotator 530 rotates the holder 531 supported by the support column 532 by rotating the support column 532 using the driver 533, whereby the wafer W held by the holder 531 is rotated.

The processing liquid supplier 540 supplies DIW and IPA to the surface of the wafer W. The processing liquid supplier 540 includes first and second nozzles 541 and 542, arms 543 and 544 that horizontally support the first nozzle 541 and the second nozzle 542, respectively, and turning lifters 545 and 546 that turn and raise/lower the arms 543 and 544, respectively. The first nozzle 541 is an example of a pure water supplier, and the second nozzle 542 is an example of an IPA supplier.

The first nozzle 541 is connected to the DIW source 549 via a valve 547 and a flow rate regulator 548. Further, the second nozzle 542 is connected to the IPA source 552 via a valve 550 and a flow rate regulator 551.

The first nozzle 541 ejects DIW supplied from the DIW source 549 to a position indicated by the controller 12. The second nozzle 542 ejects IPA supplied from the IPA source 552 to a position indicated by the controller 12.

The recovery cup 560 is disposed to surround the holder 531 and collects DIW, IPA, and the like scattered from the wafer W by the rotation of the holder 531. A drainage port 561 is formed in the bottom portion of the recovery cup 560, and the DIW, IPA, and the like collected by the recovery cup 560 are discharged from the drainage port 561 to the exterior of the liquid processor 6.

In addition, in the bottom portion of the recovery cup 560, an exhaust port 562 is formed to discharge the gas supplied from the FFU 521 to the exterior of the liquid processor 6.

(Regarding Dryer)

Figure 7:
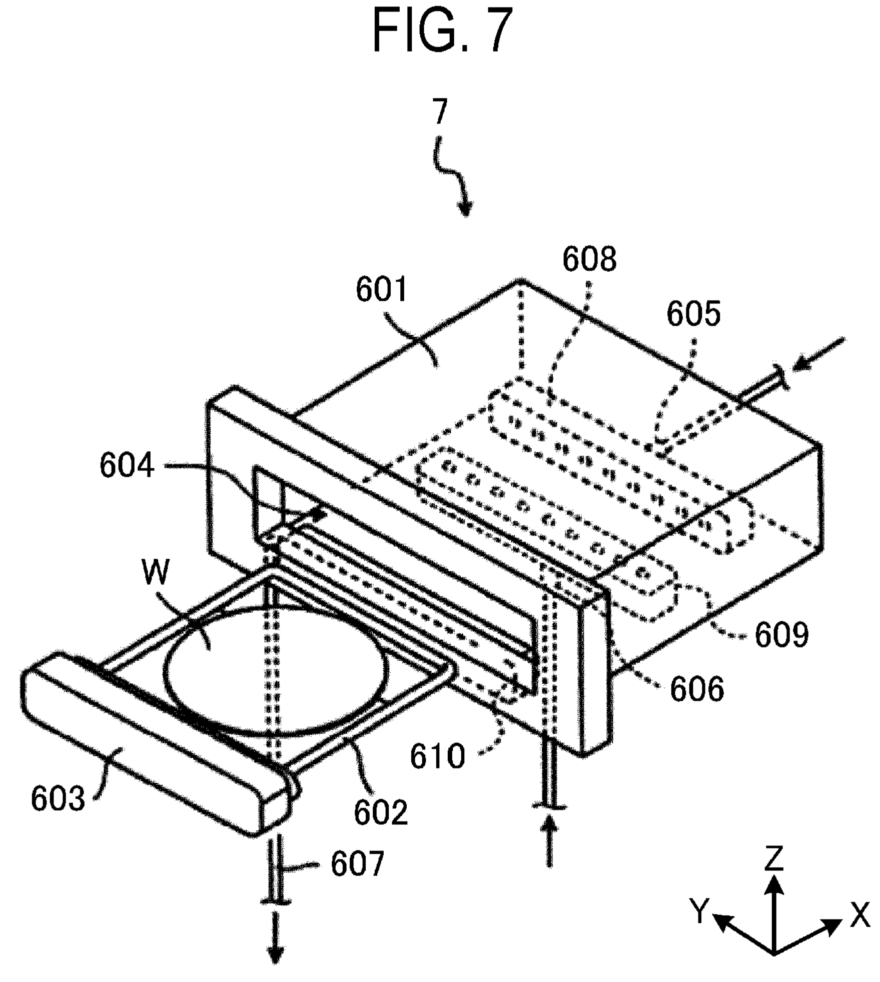
FIG. 7 is a schematic view illustrating the configuration of a dryer according to an embodiment.

Next, the configuration of the dryer 7 will be described with reference to FIG. 7. FIG. 7 is a schematic view illustrating the configuration of the dryer 7 according to an embodiment.

As illustrated in FIG. 7, the dryer 7 includes a main body 601, a holding plate 602, and a lid member 603. An opening 604 for carry-in/out of a wafer W is formed in the housing-shaped main body 601. The holding plate 602 holds a wafer W to be processed in a horizontal direction. The lid member 603 supports the holding plate 602 and closes the opening 604 when a wafer W is carried into the main body 601.

The main body 601 is a container in which a processing space capable of accommodating one wafer W is formed, and includes a wall that is provided with supply ports 605 and 606 and a discharge port 607. The supply ports 605 and 606 and the discharge port 607 are connected to a supply flow path and a discharge flow path, respectively, which allow a supercritical fluid to flow through the dryer 7.

The supply port 605 is connected to a side surface of the housing-shaped main body 601 opposite to the opening 604. The supply port 606 is connected to the bottom surface of the main body 601. The discharge port 607 is connected to the lower side of the opening 604. Although FIG. 7 illustrates two supply ports 605 and 606 and one discharge port 607, the numbers of supply ports 605 and 606 and discharge ports 607 are not particularly limited.

Inside the main body 601, fluid supply headers 608 and 609 and a fluid discharge header 610 are provided. Supply ports are formed side by side in the fluid supply headers 608 and 609 in the longitudinal direction of the fluid supply headers 608 and 609, and discharge ports are formed side by side in the fluid discharge header 610 in the longitudinal direction of the fluid discharge header 610.

The fluid supply header 608 is connected to the supply port 605 and provided inside the housing-shaped main body 601 to be adjacent to the side surface on the side opposite to the opening 604. The supply ports formed side by side in the fluid supply header 608 are directed to the opening 604 side.

The fluid supply header 609 is connected to the supply port 606 and is provided in the central portion of the bottom surface inside the housing-shaped main body 601. In addition, the supply ports formed side by side in the fluid supply header 609 are directed to the upper side.

The fluid discharge header 610 is connected to the discharge port 607 and provided inside the housing-shaped main body 601 below the opening 604 and adjacent to the side surface on the opening 604 side. In addition, the discharge ports formed side by side in the fluid discharge header 610 are directed to the upper side.

The fluid supply headers 608 and 609 supply the supercritical fluid into the main body 601. The fluid discharge header 610 guides and discharges the supercritical fluid in the main body 601 to the exterior of the main body 601. The supercritical fluid discharged to the exterior of the main body 601 via the fluid discharge header 610 includes an IPA liquid dissolved in the supercritical fluid in the supercritical state from the surface of the wafer W.

In the dryer 7, the IPA liquid between patterns formed on the wafer W is gradually dissolved in the supercritical fluid by coming into contact with the supercritical fluid which is in a high-pressure state (e.g., 16 MPa), and the IPA liquid is gradually replaced with the supercritical fluid between the patterns. Finally, only the supercritical fluid fills the space between the patterns.

After the IPA liquid is removed from the space between the patterns, the pressure inside the main body 601 is reduced from the high-pressure state to the atmospheric pressure, so that $CO_2$ changes from the supercritical state to the gas state, and the space between the patterns may be occupied only by the gas. In this way, the IPA liquid between the patterns is removed, and the drying processing of the wafer W is completed.

(Regarding Carry-Out Area)

Figure 3:
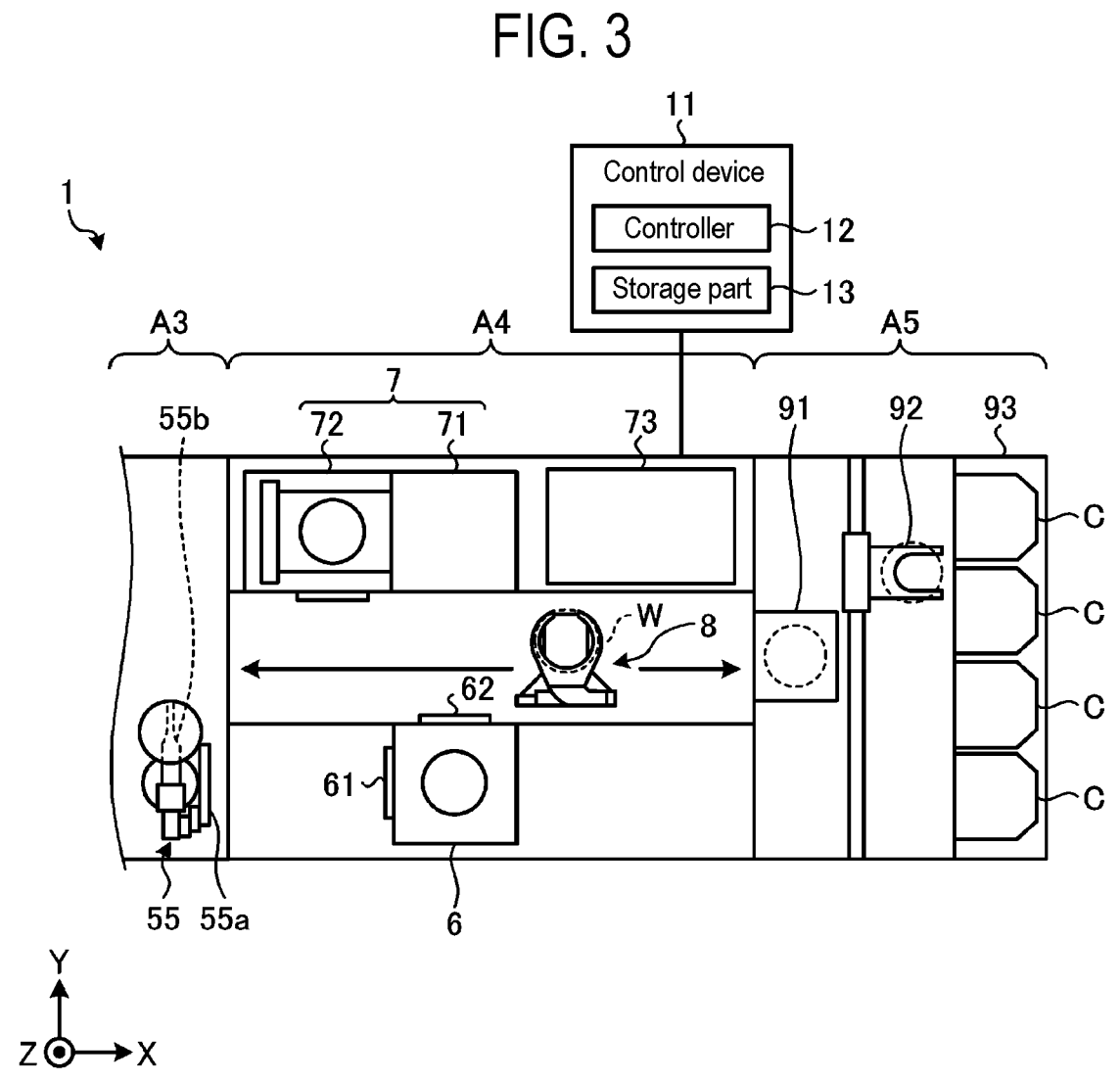

Return to the description made with reference to FIG. 3. A wafer stage 91, a sixth transport mechanism 92, and a second placement portion 93 are disposed in the carry-out area A5. The wafer stage 91, the sixth transport mechanism 92, and the second placement portion 93 are arranged in this order along the arrangement direction of the areas A1 to A5 (the X-axis direction). In addition, the wafer stage 91 is disposed adjacent to the single-wafer area A4.

The wafer W is placed on the wafer stage 91 in a horizontal posture. Both the fifth transport mechanism 8 and the sixth transport mechanism 92 are accessible to the wafer stage 91.

The sixth transport mechanism 92 includes a holding body that holds a wafer W. Further, the sixth transport mechanism 92 is capable of moving in the horizontal direction and the vertical direction and turning around the vertical axis, and transports the wafer W between the wafer stage 91 and the second placement portion 93 by the holding body. The carriers C may be placed on the second placement portion 93.

(Regarding Control Device)

The substrate processing system 1 includes a control device 11. The control device 11 is, for example, a computer, and includes a controller 12 and a storage 13. In the storage 13, programs for controlling various processes executed in the substrate processing system 1 are stored. The controller 12 controls the operation of the substrate processing system 1 by reading and executing the programs stored in the storage 13.

In addition, such programs may be stored in a computer-readable storage medium and installed in the storage 13 of the control device 11 from the storage medium. The computer-readable storage medium is, for example, a hard disk (HD), a flexible disk (FD), a compact disk (CD), a magneto-optical disk (MO), a memory card, or the like.

<Specific Operation of Substrate Processing System>

Next, a procedure of processing executed by the substrate processing system 1 will be described with reference to FIGS. 8 to 16. FIG. 8 is a flowchart illustrating a processing procedure executed by the substrate processing system 1 according to an embodiment. Each process illustrated in FIG. 8 is executed according to the control by the controller 12.

As illustrated in FIG. 8, the substrate processing system 1 takes out the plural wafers W from each of two carriers C by the second transport mechanism 30 so that the plural wafers W are carried into the substrate processing system 1, and forms a lot by the plural wafers (e.g., 25 wafers) accommodated in each carrier C (step S101).

The process of step S101 will be described with reference to FIG. 2. First, the first transport mechanism 21 takes out a carrier C from the first placement portion 20 and places the carrier C on the carrier stage 24.

Then, the second transport mechanism 30 takes out the plural wafers W from the carrier C placed on the carrier stage 24, changes the posture of the taken-out plural wafers W from the horizontal posture to the vertical posture, and places the plural wafers W on the lot holder 31. By repeating this operation twice, a lot is formed. The plural wafers W included in the lot are arranged, for example, in the state in which the main surfaces thereof face each other.

Subsequently, the substrate processing system 1 performs pre-processing on the formed lot (step S102). Specifically, the third transport mechanism 50 receives the lot from the lot holder 31 and transfers the lot to the lot immersion mechanism 42 of the pre-processor 4_1. Then, the lot immersion mechanism 42 immerses the received lot in the DHF stored in the processing tank 40.

Thereafter, the lot immersion mechanism 42 takes out the lot from the processing tank 40 and immerses the lot in the DIW stored in the processing tank 41. As a result, the DHF adhering to the wafers W are washed away by the DIW stored in the processing tank 41.

Subsequently, the substrate processing system 1 performs an etching process on the lot processed by the pre-processor 4_1 (step S103). Specifically, the third transport mechanism 50 receives the lot from the lot immersion mechanism 42 of the pre-processor 4_1 and transfers the lot to the lot immersion mechanism 45 of the etching processor 4_2.

Then, the lot immersion mechanism 45 immerses the received lot in the etching liquid stored in the processing tank 43. Thereafter, the lot immersion mechanism 45 takes out the lot from the processing tank 43 and transfers the lot to the third transport mechanism 50.

Subsequently, the third transport mechanism 50 transfers the lot received from the lot immersion mechanism 45 to the lot immersion mechanism 46. Then, the lot immersion mechanism 46 immerses the received lot in the DIW stored in the processing tank 44. As a result, the etching liquid having adhered to the wafers W is washed away by the DIW stored in the processing tank 44.

Subsequently, the substrate processing system 1 performs a cleaning process on the lot processed by the etching processor 4_2 (step S104). Specifically, the third transport mechanism 50 receives the lot from the lot immersion mechanism 46 and transfers the lot to the lot immersion mechanism 49 of the post-processor 4_3. Then, the lot immersion mechanism 49 immerses the received lot in the SC1 stored in the processing tank 47.

Subsequently, the substrate processing system 1 performs a fluid supply process on the lot processed by the lot immersion mechanism 49 (step S105). Specifically, the lot immersion mechanism 49 takes out the lot from the processing tank 47 and immerses the lot in the processing liquid L1 for rinsing stored in the processing tank 48. As a result, the SC1 having adhered to the wafers W is washed away by the processing liquid L1 stored in the processing tank 48.

Here, in the embodiment, the IPA supplier 206 supplies IPA, which is a chemical liquid having a lower surface tension than DIW (hereinafter, also referred to as a "low surface tension fluid"), to the processing tank 48 for rinsing.

As a result, the processing liquid L1 which is a rinsing liquid (DIW) including the low surface tension fluid (IPA) is stored in the processing tank 48 so that the low surface tension fluid is supplied to the wafers W by immersing the wafers W in the processing tank 48.

Figure 9:
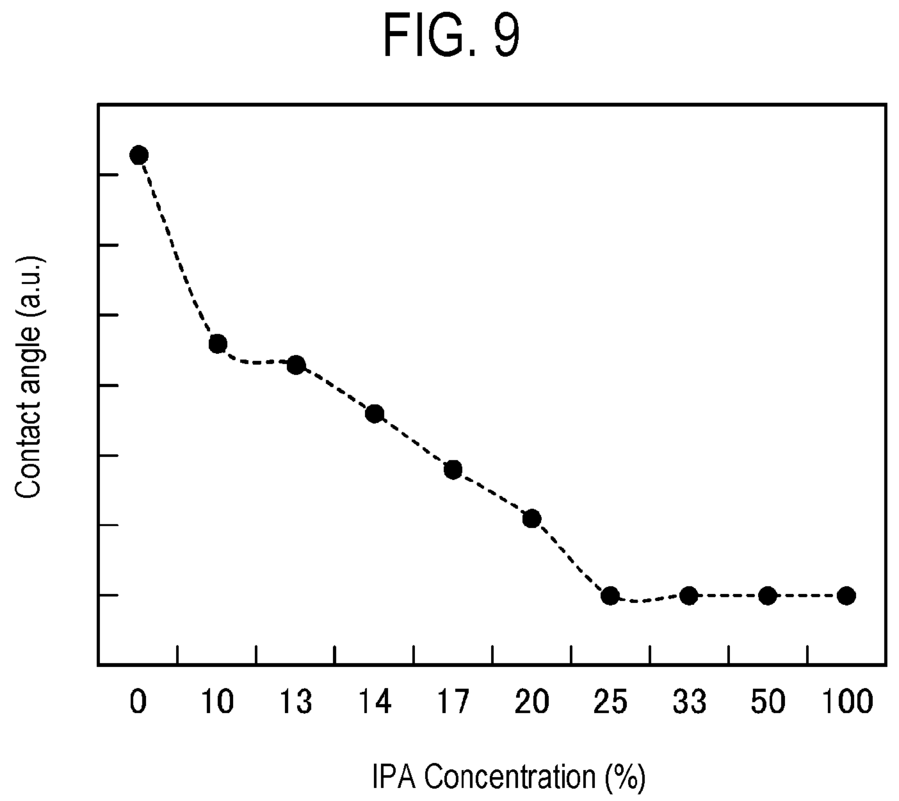
FIG. 9 is a view showing a relationship between an IPA concentration of a processing liquid and a contact angle of a wafer surface in an embodiment.

Then, by performing rinsing processing with the processing liquid L1 including the low surface tension fluid, as illustrated in FIG. 9, it is possible to make a contact angle on the surfaces of the wafers smaller than that in the case in which rinsing processing is performed with rinsing liquid composed of only DIW (that is, the IPA concentration is 0%). FIG. 9 is a view showing the relationship between the IPA concentration of the processing liquid L1 and the contact angle on the surfaces of the wafers W in the embodiment.

As a result, in the embodiment, since it is possible to improve the wettability of the entire surfaces of the wafers W, it is possible to suppress the peripheral portions of the wafers W and the like from being dried while the wafers W are being transported from the processing tank 48 to the liquid processor 6. Therefore, according to the embodiment, it is possible to suppress the collapse of the patterns formed on the surfaces of the wafers W.

Figure 10:
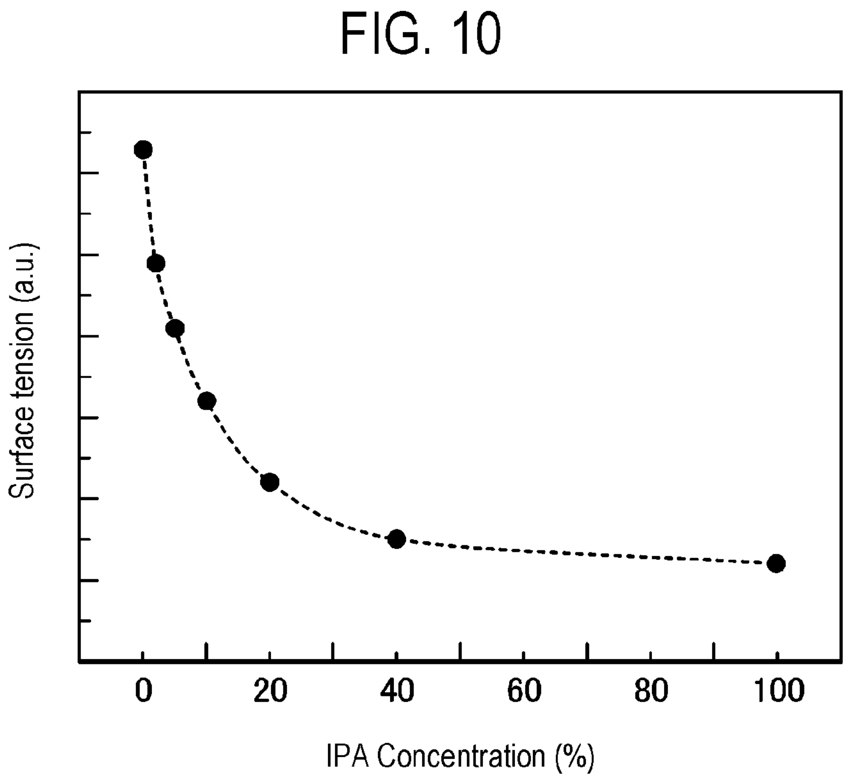
FIG. 10 is a view showing a relationship between an IPA concentration of a processing liquid and a surface tension of a wafer surface in an embodiment.

In addition, in the embodiment, by performing rinsing processing with the processing liquid L1, as illustrated in FIG. 10, it is possible to make a surface tension on the surfaces of the wafers smaller than that in the case in which rinsing processing is performed with rinsing liquid composed of only DIW (that is, the IPA concentration is 0%). FIG. 10 is a view showing the relationship between the IPA concentration of the processing liquid L1 and the surface tension of the surfaces on the wafers W in the embodiment.

As a result, in the embodiment, when the wet wafers W are transported from the processing tank 48 to the liquid processor 6, it is possible to suppress the wafers W from sticking to the holder 55*b* of the fourth transport mechanism 55 by a meniscus formed between the wafers W and the holder 55*b*.

That is, in the embodiment, it is possible to transport the wafers W from the processing tank 48 to the liquid processor 6 in the wet state and to suppress occurrence of misalignment of the wafers W by sticking to the holder 55*b* when the wafers W are placed in the carry-in port 61. Therefore, according to the embodiment, it is possible to form a favorable liquid film on the surfaces of the wafers W in the liquid processor 6.

In the embodiment, the low surface tension fluid supplied to the processing tank 48 may be IPA. As described above, by modifying the surfaces of the wafers W with the same IPA as the liquid film formed on the surfaces of the wafers W in the liquid film forming process to be described later, it is possible to reduce adverse effects caused by using a different chemical liquid (for example, an effect in which the different chemical liquid remains as an impurity and the like). Therefore, according to the embodiment, it is possible to maintain the yield of wafers W favorably.

In the embodiment, an example of using IPA as the low surface tension fluid has been illustrated, but the present disclosure is not limited to such an example. For example, methanol, ethanol, water-soluble glycol, or the like may be used as the low surface tension fluid.

In the embodiment, the low surface tension fluid may be supplied to the wafers W by supplying the low surface tension fluid into the processing tank 48. This makes it possible to perform the rinsing processing and the fluid supply process for the wafers W at the same time so that the total processing time of the wafers W can be shortened.

In the embodiment, the IPA concentration of the processing liquid L1 stored in the processing tank 48 is preferably 10% or more. As a result, as illustrated in FIGS. 9 and 10, the contact angle and surface tension on the surfaces of the wafers W can be further reduced.

Therefore, according to the embodiment, it is possible to further suppress the collapse of patterns formed on the surfaces of the wafers W, and it is possible to form a more favorable liquid film on the surfaces of the wafers W in the liquid processor 6.

In the embodiment, the IPA concentration of the processing liquid L1 stored in the processing tank 48 is preferably 25% or more, and more preferably 40% or more. As a result, as illustrated in FIGS. 9 and 10, the contact angle and surface tension on the surfaces of the wafers W can be further reduced.

In the embodiment, a densitometer (not illustrated) for measuring the IPA concentration of the processing liquid L1 stored in the processing tank 48 may be separately provided, and the controller 12 may supply IPA from the IPA supplier 206 to the processing tank 48 based on the IPA concentration of the processing liquid L1 measured by the densitometer.

For example, when the IPA concentration of the processing liquid L1 stored in the processing tank 48 becomes lower than a given concentration (e.g., 10%), the controller 12 may operate the IPA supplier 206 such that IPA may be supplied from the IPA supplier 206 to the processing tank 48.

As a result, even when the chemical liquid having adhered to the wafers W in the processing tank in which the wafers W was processed immediately before (here, the processing tank 47) is mixed with the processing liquid L1 so that the IPA concentration is lowered, it is possible to maintain the IPA concentration in the processing tank 48 to a value of a given concentration or more. Therefore, according to the embodiment, it is possible to stably supply IPA, which is a low surface tension fluid, to the wafers W.

In the embodiments described so far, an example of supplying a low surface tension fluid to wafers W by supplying the low surface tension fluid into the processing tank 48 for rinsing has been illustrated, but the present disclosure is not limited to such an example.

For example, a processing tank (not illustrated) other than the processing tank 48 for rinsing is provided separately, and only DIW is stored in the processing tank 48 for rinsing, and a mixed fluid of DIW and IPA (i.e., the processing liquid L1) is stored in the other processing tank.

Then, after the rinsing processing of a lot is performed in the processing tank 48, the controller 12 may supply a low surface tension fluid to the wafers W by causing the lot to be transported to the other processing tank and causing the lot to be immersed in the other processing tank.

This also makes it possible to reduce the contact angle and surface tension on the surfaces of the wafers W. Therefore, it is possible to suppress the patterns formed on the surfaces of the wafers W from collapsing, and to form a favorable liquid film on the surfaces of the wafers W in the liquid processor 6.

In this configuration as well, a densitometer for measuring the IPA concentration of the processing liquid L1 stored in the other processing tank may be separately provided, and the controller 12 may cause IPA to be supplied from the IPA supplier to the other processing tank based on the IPA concentration of the processing liquid L1 measured by the densitometer.

As a result, even if the rinsing liquid having adhered to the wafers W in the processing tank (here, the processing tank 48) in which the wafers W were processed immediately before is mixed with the processing liquid L1 and the IPA concentration is lowered, it is possible to maintain the IPA concentration in the other processing tank at a value of a given concentration or more. Therefore, according to the embodiment, it is possible to stably supply IPA, which is a low surface tension fluid, to the wafers W.

In addition, the embodiment may adopt a configuration in which a nozzle (not illustrated) that ejects a low surface tension fluid is separately provided in the vicinity of the opening of the processing tank 48 for rinsing, and only DIW is stored in the processing tank 48 for rinsing.

The controller 12 may cause the low surface tension fluid to be supplied such that the low surface tension fluid is sprayed to the entire surfaces of the wafers W by causing the low surface tension fluid to be ejected from the above-mentioned nozzle when the wafers W are pulled up from the processing tank 48 with the holder 55*b* after executing the rinsing processing of the lot in the processing tank 48.

This also makes it possible to reduce the contact angle and surface tension on the surfaces of the wafers W. Therefore, it is possible to suppress the patterns formed on the surfaces of the wafers W from collapsing, and to form a favorable liquid film on the surfaces of the wafers W in the liquid processor 6.

In addition, in the embodiment, the controller 12 may cause the low surface tension fluid to be supplied to the gripper (not illustrated) of the holder 55*b* by causing the low surface tension fluid to be ejected from the above-mentioned nozzle when the wafers W are pulled up from the processing tank 48 with the holder 55*b* after executing the rinsing processing of the lot in the processing tank 48.

With this configuration as well, when the wafers W are transported from the processing tank 48 to the liquid processor 6 in the state of being wet, it is possible to suppress the wafers W from sticking to the holder 55*b* of the fourth transport mechanism 55 by a meniscus formed between the wafers W and the holder 55*b*.

That is, in this configuration, it is possible to transport the wafers W from the processing tank 48 to the liquid processor 6 in the wet state and to suppress occurrence of misalignment of the wafers W by sticking to the holder 55*b* when the wafers W are placed in the carry-in port 61.

Therefore, according to the embodiment, it is possible to form a favorable liquid film on the surfaces of the wafers W in the liquid processor 6.

Return to the description made with reference to FIG. 8. Following the fluid supply process, the substrate processing system 1 performs a liquid film forming process on the wafers W processed by the post-processor 4_3 (step S106). The liquid film forming process is performed not in lot units but in single wafer W units.

First, the fourth transport mechanism 55 takes out one wafer W from the lot held in the lot immersion mechanism 49 inside the processing tank 48. Then, the fourth transport mechanism 55 changes the wafer W from the vertical posture to the horizontal posture, and then transfers the wafer W to the holder 531 in the liquid processor 6 through the carry-in port 61 (see FIG. 3).

Then, the controller 12 controls the liquid processor 6 to form an IPA liquid film on the surface of the wafer W. The details of such a liquid film forming process will be described with reference to FIGS. 11 to 16. FIGS. 11 to 16 are views illustrating the liquid film forming process according to the embodiment.

Figure 11:
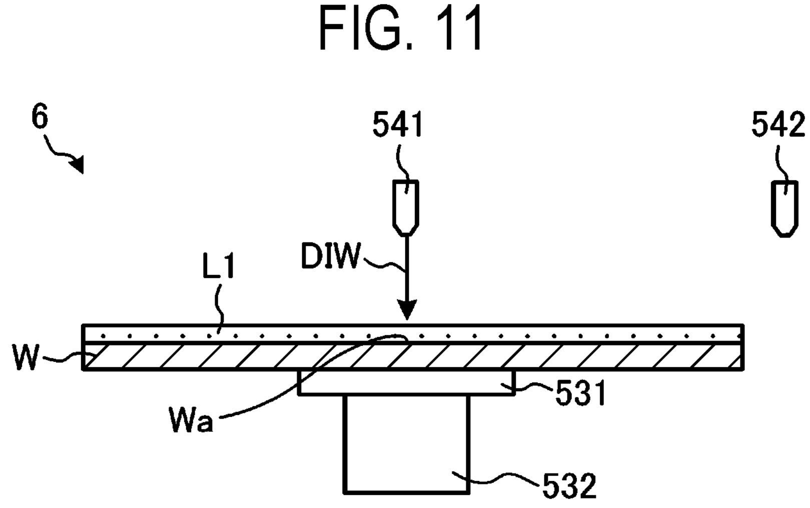
FIG. 11 is a view illustrating a liquid film forming process according to an embodiment.

As illustrated in FIG. 11, in the liquid film forming process according to the embodiment, first, the controller 12 controls the processing liquid supplier 540 to supply DIW from the first nozzle 541 toward the center Wa of the wafer W, on the surface of which a liquid film of the processing liquid L1 is formed and which is not rotating. As a result, a liquid film of DIW is formed on the entire surface of the wafer W. At this time, the second nozzle 542 is in the standby position.

Here, when the DIW is supplied to the wafer W after the wafer W is rotated at a high speed, there is a risk that at least a portion of the surface of the wafer W runs out of liquid between the time at which the wafer W starts to rotate and the time at which the DIW is supplied. As a result, the patterns formed on the surface of the wafer W may collapse.

Meanwhile, in the embodiment, the DIW is supplied to the wafer W that is not rotating (being stopped), and the wafer W is rotated after the DIW starts to be supplied to the wafer W. This makes it possible to prevent the surface of the wafer W from running out of liquid so that the collapse of the patterns formed on the surface of the wafer W can be suppressed.

In the embodiment, the timing at which the controller 12 starts rotating the wafer W may be managed by time. For example, the controller 12 may start rotating the wafer W after a lapse of a given time from the start of supplying the DIW. In addition, the controller 12 may set the timing at which the controller 12 starts rotating the wafer W based on the state of the liquid film on the surface of the wafer W monitored by a camera (not illustrated) or the like.

FIG. 11 illustrates an example in which DIW is supplied to a non-rotating wafer W, and the wafer W is rotated after the DIW starts to be supplied thereto, but the present disclosure is not limited to such an example.

For example, at the same time as the DIW is started to be ejected by the first nozzle 541 or immediately before the DIW is started to be ejected, the wafer W may be rotated at a rotation speed at which the processing liquid L1 on the wafer W is not centrifugally scattered (e.g., 30 rpm).

In addition, at the same time as the DIW is started to ejected by the first nozzle 541 or immediately before the DIW is started to be ejected, the wafer W may be rotated at a rotation acceleration at which the processing liquid L1 on the wafer W is not centrifugally scattered (e.g., 30 rpm/s).

These also make it possible to prevent the surface of the wafer W from running out of liquid so that the collapse of the patterns formed on the surface of the wafer W can be suppressed.

Figure 12:
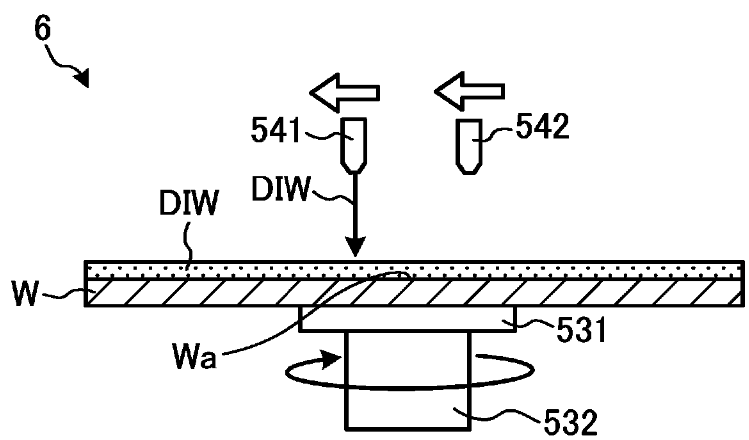
FIG. 12 is a view illustrating a liquid film forming process according to an embodiment.

Next, as illustrated in FIG. 12, the controller 12 continues to rotate the wafer W at a given rotation speed, and moves the first nozzle 541, which ejects the DIW, from the upper side of the center Wa of the wafer W to the upper side of the inner peripheral side in the intermediate portion of the wafer W. Then, the controller 12 moves the second nozzle 542 to the upper side of the inner peripheral side in the intermediate portion of the wafer W in parallel with the movement of the first nozzle 541.

In the process of FIG. 12, IPA is not ejected from the second nozzle 542. In addition, in the process of FIG. 12, the first nozzle 541 and the second nozzle 542 are disposed to be opposed each other via the center Wa of the wafer W.

Figure 13:
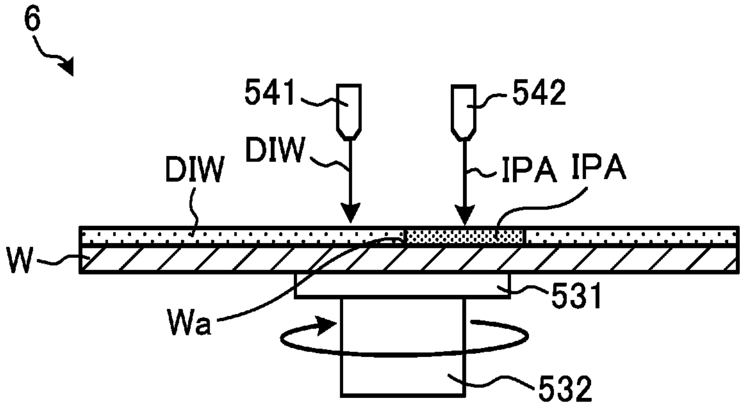
FIG. 13 is a view illustrating a liquid film forming process according to an embodiment.

Next, as illustrated in FIG. 13, the controller 12 causes IPA to be supplied toward the wafer W from the second nozzle 542 located above the inner peripheral side in the intermediate portion of the wafer W. In the process of FIG. 13, the controller 12 continues to rotate the wafer W at a given rotation speed and causes the supply of the DIW from the first nozzle 541 to the wafer W to be continued.

Figure 14:
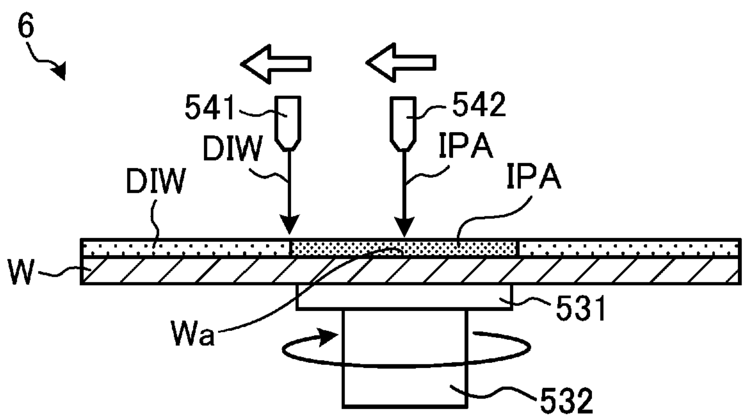
FIG. 14 is a view illustrating a liquid film forming process according to an embodiment.

Next, as illustrates in FIG. 14, the controller 12 moves the first nozzle 541, which ejects the DIW, to the upper side of the outer peripheral side in the intermediate portion of the wafer W. In addition, the controller 12 continues to rotate the wafer W at the given rotation speed in parallel with the movement of the first nozzle 541, and moves the second nozzle 542, which ejects the IPA, to the upper side of the center Wa of the wafer W.

In the process of FIG. 14, the controller 12 may gradually move the DIW supply position away from the center Wa while maintaining the distance between the first nozzle 541 and the second nozzle 542 substantially constant, and may gradually bring the IPA supply position closer to the center Wa.

As a result, when the processing liquid supplied to the center Wa of the wafer W is switched from DIW to IPA, it is possible to prevent a liquid film from being interrupted in the center Wa of the wafer W. Therefore, according to the embodiment, it is possible to suppress the collapse of the patterns formed on the surface of the wafer W.

Figure 15:
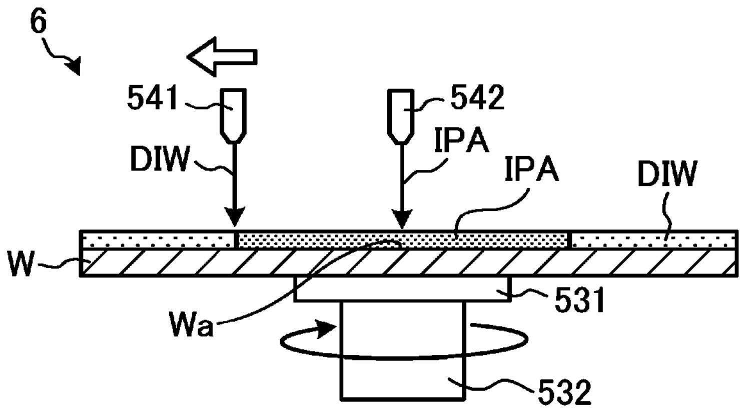
FIG. 15 is a view illustrating a liquid film forming process according to an embodiment.

Next, as illustrated in FIG. 15, the controller 12 continues to rotate the wafer W at the given rotation speed, and controls the processing liquid supplier 540 to gradually move the first nozzle 541, which ejects DIW, toward the upper side of the peripheral edge of the wafer W. At this time, the controller 12 controls the position of the first nozzle 541 such that DIW is supplied to the end of the IPA ejected by the second nozzle 542.

As a result, it is possible to prevent the liquid film from being interrupted on the surface of the wafer W due to liquid shortage (a so-called Marangoni phenomenon) that occurs in the vicinity of the end of the IPA ejected by the second nozzle 542. Therefore, according to the embodiment, it is possible to suppress the collapse of the patterns formed on the surface of the wafer W.

Figure 16:
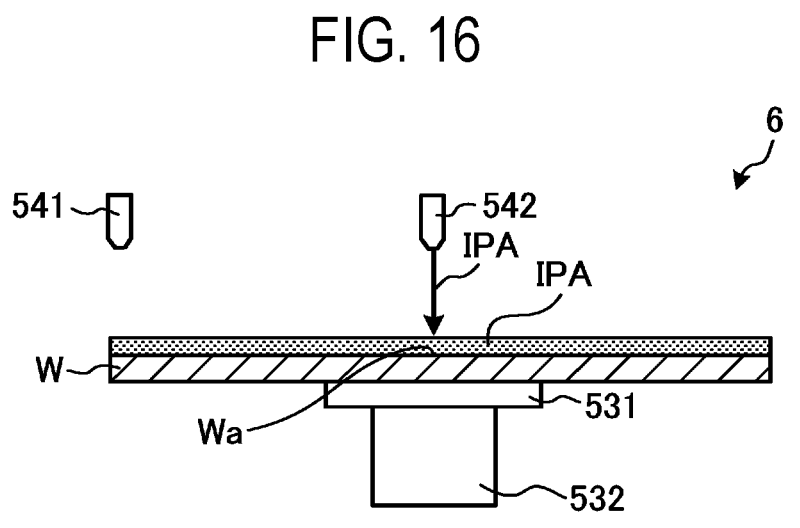

Next, as illustrated in FIG. 16, the controller 12 controls the processing liquid supplier 540 to stop the supply of DIW from the first nozzle 541 that has reached the peripheral edge of the wafer W, and at the same time, stops the rotation of the wafer W. As a result, an IPA liquid film is formed on the entire surface of the wafer W.

As described so far, in the liquid film forming process according to the embodiment, the liquid film of the processing liquid L1 formed on the entire surface of the wafer W is once replaced with DIW, and then DIW on the entire surface of the wafer W is replaced with IPA to form an IPA liquid film on the surface of the wafer W.

As a result, it is possible to prevent the liquid film from being interrupted on the surface of the wafer W due to liquid shortage that occurs in the vicinity of the end of the IPA ejected by the second nozzle 542. Therefore, according to the embodiment, it is possible to suppress the collapse of the patterns formed on the surface of the wafer W.

Return to the description made with reference to FIG. 8. Following the liquid film forming process, the substrate processing system 1 performs a drying process on the wafer W after the liquid film forming process (step S107).

Specifically, the fifth transport mechanism 8 takes out a wafer W from the liquid processor 6 through the carry-out port 62, and the taken-out wafer W is transferred to the holding plate 602 (see FIG. 7) placed in the delivery area 72 (see FIG. 3). Subsequently, the dryer 7 moves the holding plate 602 to the processing area 71 to dispose the wafer W inside the main body 601.

Subsequently, the dryer 7 supplies a supercritical fluid into the main body 601. As a result, the pressure in the main body 601 is boosted from the atmospheric pressure to a given first pressure. Here, the first pressure is a pressure equal to or higher than a critical pressure (about 7.2 MPa) at which $CO_2$, which is a supercritical fluid, is in a supercritical state, and is, for example, about 16 MPa.

Therefore, by supplying the supercritical fluid into the main body 601, the supercritical fluid in the main body 601 undergoes a phase change to the supercritical state. Then, the IPA on the wafer W begins to dissolve into the supercritical fluid in such a supercritical state.

Thereafter, the pressure inside the main body 601 is reduced from the high-pressure state to the atmospheric pressure, so that the $CO_2$ changes from the supercritical state to the gas state, and the space between the patterns may be occupied only by the gas. In this way, the IPA liquid between the patterns is removed, and the drying process of the wafer W is completed.

As described above, in the embodiment, by drying the surface of the wafer W using a supercritical fluid, it is possible to suppress the patterns formed on a wafer W from collapsing due to the surface tension of DIW during drying.

Subsequently, the substrate processing system 1 performs a carry-out process of accommodating the dried wafer W in the carrier C (step S108).

Specifically, the dryer 7 moves the holding plate 602 to the delivery area 72, and the fifth transport mechanism 8 receives the dried wafer W from the holding plate 602. Subsequently, the fifth transport mechanism 8 places the received wafer W on the wafer stage 91. Then, the sixth transport mechanism 92 takes out the wafer W from the wafer stage 91 and accommodates the wafer W in the carrier C mounted on the second placement portion 93.

A substrate processing apparatus (the substrate processing system 1) according to an embodiment includes a batch processors (the pre-processor 4_1, the etching processor 4_2, and the post-processor 4_3) and single-wafer processors (the liquid processor 6 and the dryer 7), and a transport portion (the fourth transport mechanism 55). The batch processors (the pre-processor 4_1, the etching processor 4_2, and the post-processor 4_3) collectively process a lot including plural substrates (wafers W). The single-wafer processors (the liquid processor 6 and the dryer 7) process substrates (wafers W) contained in the lot one by one. The transport portion (the fourth transport mechanism 55) delivers substrates (wafers W) one by one between the batch processors (the pre-processor 4_1, the etching processor 4_2, and the post-processor 4_3) and the single-wafer processors (the liquid processor 6 and dryer 7). In addition, the batch processors (the pre-processor 4_1, the etching processor 4_2, and the post-processor 4_3) include a processing tank 48 for storing the processing liquid L1 including a rinsing liquid. Furthermore, the transport portion (the fourth transport mechanism 55) includes a fluid supplier (the IPA supplier 206). After receiving the substrates (wafers W) included in the lot in the processing tank 48 and until delivering the substrates to the single-wafer processors, the fluid supplier (the IPA supplier 206) supplies a low surface tension fluid having a surface tension lower than that of the rinsing liquid to at least one of the processing tank 48 and the substrates (wafers W). This makes it possible to suppress the collapse of the patterns formed on the surfaces of the wafers W.

In the substrate processing apparatus (the substrate processing system 1) according to an embodiment, the fluid supplier (the IPA supplier 206) supplies the low surface tension fluid to the processing tank 48. This makes it possible to shorten the total processing time of the wafers W.

In the substrate processing apparatus (the substrate processing system 1) according to an embodiment, the low surface tension fluid is IPA, and the processing liquid L1 stored in the processing tank 48 has an IPA concentration of 10% or more. This makes it possible to suppress the collapse of the patterns formed on the surfaces of the wafers W so that a more favorable film can be formed on the surfaces of the wafers W in the liquid processor 6.

The substrate processing apparatus (the substrate processing system 1) according to an embodiment further includes a densitometer configured to measure the IPA concentration of the processing liquid L1 stored in the processing tank 48, and a controller 12 for controlling each part of the substrate processing apparatus (the substrate processing system 1). In addition, the controller 12 causes the IPA to be supplied to the processing tank 48 from the fluid supplier (the IPA supplier 206) based on the IPA concentration of the processing liquid L1 measured by the densitometer. This makes it possible to stably supply the IPA, which is a low surface tension fluid, to the wafers W.

In the substrate processing apparatus (the substrate processing system 1) according to an embodiment, the fluid supplier includes a nozzle that ejects the low surface tension fluid to the substrates (wafers W) when the substrates (wafers W) are pulled up from the processing tank 48. This makes it possible to suppress the collapse of the patterns formed on the surfaces of the wafers W.

In the substrate processing apparatus (the substrate processing system 1) according to an embodiment, the transport portion (the fourth transport mechanism 55) includes a gripper that grips peripheral edges of the substrates (wafers W), and the fluid supplier supplies the low surface tension fluid to the gripper. This makes it possible to form a favorable liquid film on the surfaces of the wafers W in the liquid processor 6.

In the substrate processing apparatus (the substrate processing system 1) according to an embodiment, the low surface tension fluid is IPA. This makes it possible to maintain the yield of wafers W favorably.

The substrate processing apparatus (the substrate processing system 1) according to an embodiment further includes a controller 12 configured to control each part. In addition, the single-wafer processor includes a liquid processor 6 including a holder 531 configured to rotatably hold the substrates (wafers W), a pure water supplier (the first nozzle 541) configured to supply pure water to the substrates (wafers W), and an IPA supplier (e.g., the second nozzle 542) configured to supply IPA to the substrates (wafers W). The controller 12 replaces the liquid film of the processing liquid L1 formed on surfaces of the substrates (wafers W) held by the holder 531 with pure water, and then replaces pure water on the surfaces of the substrates (wafers W) with IPA. This makes it possible to suppress the collapse of the patterns formed on the surfaces of the wafers W.

In the substrate processing apparatus (the substrate processing system 1) according to an embodiment, the controller 12 sets a rotation speed of the substrates (wafers W) to a rotation speed at which the processing liquid L1 on the substrates (wafers W) is not centrifugally scattered when the pure water is supplied to the substrates (wafers W). This makes it possible to suppress the collapse of the patterns formed on the surfaces of the wafers W.

In the substrate processing apparatus (the substrate processing system 1) according to an embodiment, the single-wafer processor includes a dryer 7 that dries the substrates (wafers W). In addition, the dryer 7 brings the substrates (wafers W) in a state in which the surfaces thereof are wet into contact with a processing fluid in a supercritical state to dry the substrates (wafers W). This makes it possible to suppress the collapse of the patterns formed on the surfaces of the wafers W.

A substrate processing method according to an embodiment includes a batch processing step, a single-wafer processing step, and a transport step. In the batch processing step, a lot including plural substrates (wafers W) are collectively processed. In the single-wafer processing step, the substrates (wafers W) included in the lot are processed one by one. In the transport step, the substrates (wafers W) are transported one by one between the batch processing step and the single-wafer processing step. The batch processing step includes an immersion step of immersing the lot in the processing tank 48 that stores a processing liquid L1 including a rinsing liquid. In addition, the transport step includes a fluid supply step. In the fluid supply step, after the substrates (wafers W) included in the lot in the processing tank 48 are received and until the substrates are delivered to the single-wafer processing step, a low surface tension fluid having a lower surface tension than the rinsing liquid is supplied to at least one of the processing tank 48 and the substrates (wafers W). This makes it possible to suppress the collapse of the patterns formed on the surfaces of the wafers W.

Although the embodiments of the present disclosure have been described above, the present disclosure is not necessarily limited to the above-described embodiments, and various changes can be made without departing from the spirit of the present disclosure.

The embodiments disclosed herein should be considered to be exemplary in all respects and not restrictive. Indeed, the embodiments described above may be implemented in various forms. The above-described embodiments may be omitted, replaced, or modified in various forms without departing from the scope and spirit of the appended claims.

According to the present disclosure, it is possible to suppress the collapse of a pattern formed on the surface of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:

a batch processor configured to collectively process a lot including plural substrates and including a processing tank;

a single-wafer processor configured to process the substrates included in the lot one by one;

a transport portion configured to deliver the substrates one by one between the batch processor and the single-wafer processor; and a controller configured to control each part of the substrate processing apparatus, wherein the processing tank stores a processing liquid that includes a rinsing liquid and a low surface tension fluid in a concentration of 10% or more, wherein the low surface tension fluid has a lower surface tension than the rinsing liquid, the processing tank including an inner tank configured to receive the substrate included in the lot and an outer tank arranged around an upper portion of the inner tank, wherein the processing tank includes a fluid supplier and a circulator including a circulation line interconnecting the inner tank and the outer tank, wherein the processing liquid is circulated from the outer tank to the inner tank via the circulation line and from the inner tank to the outer tank via the processing liquid overflowing from the inner tank, wherein the fluid supplier comprises a fluid source storing the low surface tension fluid and a supply line interconnecting the fluid source and the outer tank, and wherein the controller is configured to control the fluid supplier to supply the low surface tension fluid to the outer tank to be mixed in the concentration of 10% or more with the rinsing liquid to form the processing liquid, while the transport portion is moving the substrate from the inner tank of the processing tank to the single-wafer processor in a state in which the substrates are wet by the processing liquid.

2. The substrate processing apparatus of claim 1, wherein the low surface tension fluid is IPA.

3. The substrate processing apparatus of claim 2, further comprising:

a densitometer configured to measure an IPA concentration of the processing liquid stored in the processing tank, wherein the controller is further configured to supply the IPA from the fluid supplier to the processing tank based on the IPA concentration of the processing liquid measured by the densitometer.

4. The substrate processing apparatus of claim 1, wherein the single-wafer processor includes a liquid processor including a substrate rotator configured to hold and rotate the substrates included in the lot one by one, a pure water supplier configured to supply pure water to the substrates, and an IPA supplier configured to supply IPA to the substrates, wherein the substrate rotator includes a holder configured to hold the substrate horizontally, a support column extending in a vertical direction, and a driver configured to rotate the support column, wherein the controller is further configured to replace the processing liquid remaining on surfaces of the substrates held by the holder with the pure water, and then replace the pure water on the surfaces of the substrates with the IPA, and wherein the substrate rotator is configured to rotate the holder supported by the support column by rotating the support column using the driver, whereby the substrate held by the holder is rotated.

5. The substrate processing apparatus of claim 4, wherein the controller is further configured to set a rotation speed of the substrates to a rotation speed at which the processing liquid on the substrates is not centrifugally scattered when the pure water is supplied to the substrates.

6. The substrate processing apparatus of claim 1, wherein the single-wafer processor includes a dryer configured to dry each of the substrates, the dryer includes a housing-shaped main body having an opening and supply ports, a holding plate configured to hold each of the substrates, and a lid member configured to support the holding plate and close the opening when each of the substrates is carried into the main body, and the dryer is further configured to bring the substrates in a state in which surfaces of the substrates are wet into contact with a supercritical fluid to dry the substrates by supplying the supercritical fluid into the main body of the dryer through the supply ports.

* * * * *